(12) United States Patent
Li

(10) Patent No.: US 11,366,137 B2
(45) Date of Patent: Jun. 21, 2022

(54) TEMPERATURE COMPENSATION METHOD FOR SAR SENSOR OF TERMINAL, AND TERMINAL

(71) Applicant: XI'AN YEP TELECOMMUNICATION TECHNOLOGY, LTD., Xi'an (CN)

(72) Inventor: Wei Li, Xi'an (CN)

(73) Assignee: XI'AN YEP TELECOMMUNICATION TECHNOLOGY, LTD., Xi'an (CN)

( * ) Notice: Subject to any disclaimer, the term of this patent is extended or adjusted under 35 U.S.C. 154(b) by 86 days.

(21) Appl. No.: 17/043,047

(22) PCT Filed: Nov. 28, 2018

(86) PCT No.: PCT/CN2018/117988
§ 371 (c)(1),
(2) Date: Sep. 29, 2020

(87) PCT Pub. No.: WO2019/196424
PCT Pub. Date: Oct. 17, 2019

(65) Prior Publication Data
US 2021/0018534 A1 Jan. 21, 2021

(30) Foreign Application Priority Data
Apr. 10, 2018 (CN) .......................... 201810315697.X

(51) Int. Cl.
*G01R 1/44* (2006.01)
*G01R 31/00* (2006.01)
*G01S 13/90* (2006.01)

(52) U.S. Cl.
CPC ............. *G01R 1/44* (2013.01); *G01R 31/001* (2013.01); *G01S 13/9094* (2013.01)

(58) Field of Classification Search
CPC .... G01R 1/44; G01R 29/0814; G01R 31/001; G01R 29/0878; G01S 13/9094;
(Continued)

(56) References Cited

U.S. PATENT DOCUMENTS 8,467,840 B2 * 6/2013 Lin ........................ H01Q 1/245
455/90.3
9,247,504 B2 * 1/2016 Erkens ................. H04B 1/3838
(Continued)

FOREIGN PATENT DOCUMENTS

| CN | 103493552 | 1/2014 |
|---|---|---|
| CN | 103703840 | 4/2014 |

(Continued)

OTHER PUBLICATIONS

English language translation of Office Action for China Patent Application No. 201810315697.X; dated Apr. 30, 2019.
(Continued)

*Primary Examiner* — Vinh P Nguyen
(74) *Attorney, Agent, or Firm* — The PL Law Group, PLLC

(57) ABSTRACT

A temperature compensation method for a SAR sensor (3) of a terminal, and a terminal are disclosed. The terminal comprises: a temperature sensing unit (1), a processor (2), and an SAR sensor (3); the temperature sensing unit (1) is configured to send a first trigger signal to the processor (2) in response to detecting that a temperature change amount of the SAR sensor (3) exceeds a preset value; the processor (2) is configured to send a first temperature control signal to the SAR sensor (3) upon receiving the first trigger signal; and the SAR sensor (3) is configured to activate a second-order temperature compensation of the SAR sensor (3) according to the first temperature control signal, and the second-order temperature compensation compensates for baseline data of
(Continued)

the SAR sensor (3) together with a first-order temperature compensation of the SAR sensor (3). Therefore, real-time tracking of the temperature change amount by the baseline data of the SAR sensor (3) can be ensured, and the problem in the terminal of false trigger of the SAR sensor (3) caused by drastic temperature change can be avoided.

13 Claims, 3 Drawing Sheets

(58) Field of Classification Search
CPC ..... H04B 1/3838; H04B 1/04; H04W 52/283; H04W 52/221; Y02B 70/30; G01K 7/00; G01K 7/346; G01K 2219/00; H01Q 1/245

See application file for complete search history.

(56) References Cited

U.S. PATENT DOCUMENTS

| | | | | |
|---|---|---|---|---|
| 9,621,222 | B2* | 4/2017 | Shin | H04B 1/3838 |
| 9,871,545 | B2* | 1/2018 | Khawand | H04B 1/3838 |
| 9,997,824 | B2* | 6/2018 | Lehmann | H04M 1/0202 |
| 10,893,488 | B2* | 1/2021 | Khawand | H04W 52/367 |

FOREIGN PATENT DOCUMENTS

| | | |
|---|---|---|
| CN | 105137375 | 12/2015 |
| CN | 106900051 | 6/2017 |
| CN | 107005951 | 8/2017 |
| KR | 20070014384 | 2/2007 |

OTHER PUBLICATIONS

English Translation of International Search Report for International application No. PCT/CN2018117988 , dated Feb. 27, 2019.
English Translation of Written Opinion for International application No. PCT/CN2018117988 , dated Feb. 27, 2019.
International Search Report for International application No. PCT/CN2018117988 , dated Feb. 27, 2019.
Written Opinion for International application No. PCT/CN2018117988, dated Feb. 27, 2019.
Office Action from for China Patent Application No. 201810315697.X , dated Apr. 23, 2019.
International Preliminary Report on Patentability International application No. PCT/CN2018117988, dated Oct. 13, 2020.
International Preliminary Report on Patentability, English Translation, International application No. PCT/CN2018117988, dated Oct. 13, 2020.

* cited by examiner

TEMPERATURE COMPENSATION METHOD FOR SAR SENSOR OF TERMINAL, AND TERMINAL

CROSS-REFERENCE TO RELATED APPLICATIONS

This application is a national phase filing under 35 U.S.C. § 371 of PCT International Application PCT/CN2018/117988, filed Nov. 28, 2018, and published under PCT Article 21(2) in Chinese as WO/2019/196424 on Oct. 17, 2019. PCT/CN2018/117988 claimed priority benefit of China Patent Application No. 201810315697.X filed Apr. 10, 2018. The above identified applications are hereby incorporated by reference in their entirety.

TECHNICAL FIELD

The present application relates to the technical field of terminals, and in particular to a temperature compensation method for an SAR sensor of a terminal, and a terminal.

BACKGROUND

SAR (Specific Absorption Rate), which is an absorption rate of electromagnetic wave energy of a mobile phone or a wireless product, is defined as: an induced electromagnetic field will be generated in a human body in the presence of an external electromagnetic field, and the "SAR" value is used by the international scientific community for quantizing and measuring radiation of the mobile phone. With the development of mobile communication, handheld mobile terminals, e.g., mobile phones, tablets and the like, are closer to people's life, people use the mobile terminals more and more frequently and the use time continues to increase.

At present, a temperature compensation mechanism is introduced into an SAR sensor in a handheld terminal to realize a relatively accurate decision mechanism, but even so, a problem of false trigger of the SAR sensor caused by inaccurate temperature compensation still occurs. Some False triggers of SAR sensors will occur in certain scenarios with relatively rapid temperature change, and FIG. 1 shows an application scenario with relatively rapid temperature change. Since the parasitic capacitance has a minimum value in a period from t0 to t1, it can be determined that the human body is far away during the period from t0 to t1. At t1 point, it is detected that the human body is approaching because a change amount of the parasitic capacitance exceeds a preset threshold. After being long-time handheld by the human hand from t1 to t2, the temperature of the handheld terminal reaches about 37° C., then the human hand leaves the terminal at t2 point, and at this time the system should determine that the human body is far away. However, since the temperature detection compensation mechanism of the SAR sensor cannot track the temperature change quickly, the system determines the far-away state of the human body till at t3 point, but in fact, the decision of the system from t2 to t3 is a false trigger.

Therefore, in some application scenarios with relatively rapid temperature change, it is an urgent technical problem to be solved as how to avoid false trigger of the SAR sensor of a terminal.

SUMMARY

Embodiments of the present application provide a temperature compensation method for an SAR sensor of a terminal and a terminal, for avoiding false trigger of the SAR sensor in some application scenarios with relatively rapid temperature change.

In a first aspect, an embodiment of the present application provides a terminal comprising a temperature sensing unit, a processor and an SAR sensor;

the temperature sensing unit is electrically connected with the processor and configured to send a first trigger signal to the processor in response to detecting that a temperature change amount of the SAR sensor exceeds a preset value;

the processor is electrically connected with the SAR sensor and configured to send a first temperature control signal to the SAR sensor upon receiving the first trigger signal; and the SAR sensor is configured to activate a second-order temperature compensation of the SAR sensor according to the first temperature control signal, wherein the second-order temperature compensation compensates for baseline data of the SAR sensor together with a first-order temperature compensation of the SAR sensor.

In a possible implementation, the temperature sensing unit comprises a temperature sensor, a differential conversion circuit and a comparator;

the temperature sensor is configured to send a measured temperature to the differential conversion circuit;

the differential conversion circuit is electrically connected with the temperature sensor and configured to calculate a temperature change amount according to the temperature sent by the temperature sensor within a preset time period; determine a trigger voltage according to the temperature change amount and a preset thermoelectric conversion coefficient, and send the trigger voltage to the comparator; and the comparator is electrically connected with the differential conversion circuit and configured to compare the trigger voltage with a preset voltage and send the first trigger signal to the processor if the trigger voltage is greater than the preset voltage.

In a possible implementation, the comparator is further configured to send a second trigger signal to the processor if the trigger voltage is less than the preset voltage;

the processor is further configured to send a second temperature control signal to the SAR sensor upon receiving the second trigger signal; and the SAR sensor is further configured to stop the second-order temperature compensation according to the second temperature control signal, and the first-order temperature compensation of the SAR sensor functions to compensate for the baseline data of the SAR sensor.

In a possible implementation, the temperature sensor is disposed on a periphery of the SAR sensor.

In a possible implementation, the SAR sensor is configured to perform the first-order temperature compensation according to a formula $$f(T)=f(T_0)+s(T-T_0); \text{ and}$$

perform the second-order temperature compensation according to formulas $$f(T)=f(T_0)+s(T-T_0)+r(T-T_0)^2;$$

$$r=V_{out} \times F;$$

where $T_0$ is a normal temperature, T is a current temperature, $f(T_0)$ is a basic electromagnetic wave absorption ratio when the temperature is $T_0$, s is a first-order compensation coefficient, $V_{out}$ is a trigger voltage, F is a proportional coefficient and r is a second-order compensation coefficient.

In a possible implementation, the differential conversion circuit is configured to determine the trigger voltage according to a formula $$V_{out} = K \times \left|\frac{\Delta T}{t}\right|,$$

where K is a proportional constant, $\Delta T$ is a temperature change amount within a preset time period t, and $V_{out}$ is the trigger voltage.

In a possible implementation, the SAR sensor is electrically connected with an antenna of the terminal and is configured to receive a parasitic capacitance detected by the antenna; and the SAR sensor is further configured to determine that a human body is close to the terminal if a difference between the parasitic capacitance and the baseline data is greater than a preset threshold; and otherwise, determine that the human body is far away from the terminal.

In a second aspect, an embodiment of the present application further provides a temperature compensation method for a SAR sensor of a terminal, comprising:
receiving a first trigger signal sent by a temperature sensing unit, wherein the first trigger signal is generated by the temperature sensing unit response to detecting that a temperature change amount of the SAR sensor exceeds a preset value; and sending a first temperature control signal to the SAR sensor according to the first trigger signal, wherein the first temperature control signal is used for instructing the SAR sensor to activate a second-order temperature compensation, and the second-order temperature compensation compensates for baseline data of the SAR sensor together with a first-order temperature compensation of the SAR sensor.

In a possible implementation, after the second-order temperature compensation and the first-order temperature compensation of the SAR sensor together compensate for baseline data of the SAR sensor, the method further comprises:
receiving a second trigger signal sent by the temperature sensing unit, wherein the second trigger signal is generated by the temperature sensing unit in response to detecting that the temperature change amount does not exceed the preset value; and sending a second temperature control signal to the SAR sensor according to the second trigger signal, wherein the second temperature control signal is used for instructing the SAR sensor to stop the second-order temperature compensation, and the first-order temperature compensation functions to compensate for the baseline data of the SAR sensor.

In a possible implementation, the first-order temperature compensation is performed according to a formula $f(T)=f(T_0)+s(T-T_0)$; and
the second-order temperature compensation is performed according to formulas $$f(T)=f(T_0)+s(T-T_0)+r(T-T_0)^2 \text{ and } r=V_{out} \times F;$$

where $T_0$ is a normal temperature, T is a current temperature, $f(T_0)$, s is a basic electromagnetic wave absorption ratio when the temperature is $T_0$, s is a first-order compensation coefficient, $V_{out}$ is a trigger voltage, F is a proportional coefficient and r is a second-order compensation coefficient.

In a possible implementation, the temperature sensing unit includes a temperature sensor, a differential conversion circuit and a comparator, and before receiving the first trigger signal sent by the temperature sensing unit, the method further comprises:

the differential conversion circuit receiving a temperature measured by the temperature sensor and calculates a temperature change amount according to the temperature sent by the temperature sensor within a preset time period; determining a trigger voltage according to the temperature change amount and a preset thermoelectric conversion coefficient, and sending the trigger voltage to the comparator, so that the comparator compares the trigger voltage with a preset voltage and sends the first trigger signal if the trigger voltage is greater than the preset voltage.

In a possible implementation, the method further comprises: receiving, by the SAR sensor, a parasitic capacitance detected by an antenna of the terminal, and determining that a human body is close to the terminal if a difference between the parasitic capacitance and the baseline data is greater than a preset threshold; otherwise, determining that the human body is far away from the terminal.

In a third aspect, an embodiment of the present application provides a terminal comprising a memory and a processor, wherein
the memory is configured to store program instructions; and the processor is configured to call the program instructions stored in the memory and perform the method as described in the second aspect or any possible implementation of the second aspect according to the called program.

In a fourth aspect, an embodiment of the present application provide a computer storage medium, wherein the computer readable storage medium stores computer-executable instructions for enabling a computer to perform the method as described in the second aspect or any possible implementation of the second aspect.

In a fifth aspect, an embodiment of the present application provides a computer program product comprising a computer program stored on a computer-readable storage medium, the computer program comprising program instructions that, when executed by a computer, cause the computer to perform the method as described in the second aspect or any possible implementation of the second aspect.

The terminal provided by the above embodiment comprises: a temperature sensing unit, a processor and an SAR sensor; the temperature sensing unit is electrically connected with the processor and configured to send a first trigger signal to the processor in response to detecting that a temperature change amount of the SAR sensor exceeds a preset value; the processor is electrically connected with the SAR sensor and configured to send a first temperature control signal to the SAR sensor upon receiving the first trigger signal; and the SAR sensor is configured to activate a second-order temperature compensation of the SAR sensor according to the first temperature control signal, wherein the second-order temperature compensation compensates for baseline data of the SAR sensor together with a first-order temperature compensation of the SAR sensor. It can be seen that, when the temperature change amount exceeds the preset value, the first trigger signal is sent to the processor, and the processor sends the first temperature control signal to the SAR sensor after receiving the first trigger signal. Then, the SAR sensor activates the second-order temperature compensation of the SAR sensor according to the first temperature control signal, i.e. the second-order temperature compensation and the first-order temperature compensation of the SAR sensor together compensate for the baseline data of the SAR sensor. Therefore, in some application scenarios with relatively rapid temperature change, the second-order temperature compensation and the first-order temperature compensation of the SAR sensor together compensate for the baseline data of the SAR sensor, so as to ensure that the baseline data of the SAR sensor can track the temperature change amount in real time, and to avoid the problem of false trigger of the SAR sensor caused by the terminal when the temperature drastically changes from low to high or from high to low; if the temperature change amount does not exceed the preset value, the second-order temperature compensation will not be triggered, and the first-order temperature compensation of the SAR sensor is still adopted to compensate for the baseline data of the SAR sensor, and thus it can be ensured that the problem of false trigger of the SAR sensor will not occur in various temperature change scenarios of the terminal.

The temperature compensation method for a SAR sensor of a terminal provided by the above embodiment comprises: receiving a first trigger signal sent by a temperature sensing unit, wherein the first trigger signal is generated by the temperature sensing unit in response to detecting that a temperature change amount of the SAR sensor exceeds a preset value; and then sending a first temperature control signal to the SAR sensor according to the first trigger signal, wherein the first temperature control signal is used for instructing the SAR sensor to activate a second-order temperature compensation, and the second-order temperature compensation compensates for baseline data of the SAR sensor together with a first-order temperature compensation of the SAR sensor. It can be seen that, when the temperature change amount exceeds the preset value, the first trigger signal is sent to the processor, and the processor sends the first temperature control signal to the SAR sensor after receiving the first trigger signal, and then the SAR sensor activates the second-order temperature compensation of the SAR sensor according to the first temperature control signal, i.e. the second-order temperature compensation and the first-order temperature compensation of the SAR sensor together compensate for the baseline data of the SAR sensor. Therefore, in some application scenarios with relatively rapid temperature change, the second-order temperature compensation and the first-order temperature compensation of the SAR sensor together compensate for the baseline data of the SAR sensor, so as to ensure that the baseline data of the SAR sensor can track the temperature change amount in real time, and to avoid the problem of false trigger of the SAR sensor caused by the terminal when the temperature drastically changes from low to high or from high to low; if the temperature change amount does not exceed the preset value, the second-order temperature compensation will not be triggered, and the first-order temperature compensation of the SAR sensor is still adopted to compensate for the baseline data of the SAR sensor, and thus it can be ensured that the problem of false trigger of the SAR sensor will not occur in various temperature change scenarios of the terminal.

BRIEF DESCRIPTION OF THE DRAWINGS

In order to more clearly illustrate the technical solutions in the embodiments of the present application, the accompanying drawings to be used in the description of the embodiments will be briefly introduced below.

DETAILED DESCRIPTION

The present application is further described in detail below with reference to the accompanying drawings.

Figure 1:
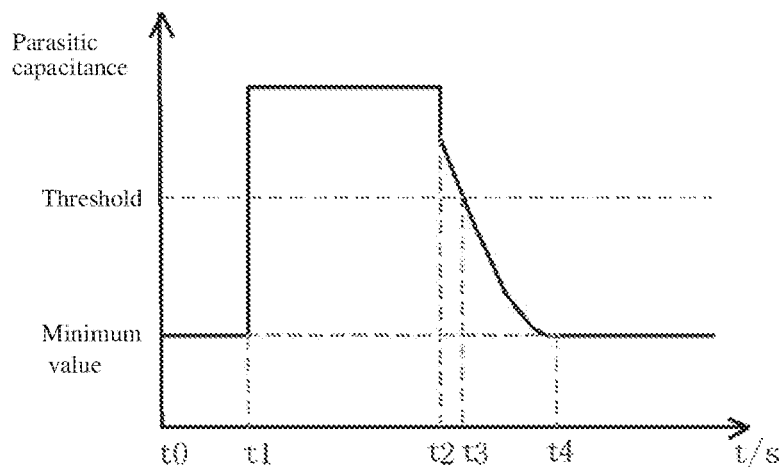
FIG. 1 is a schematic diagram of an application scenario with a relatively rapid temperature change according to an embodiment of the present invention.
Figure 2:
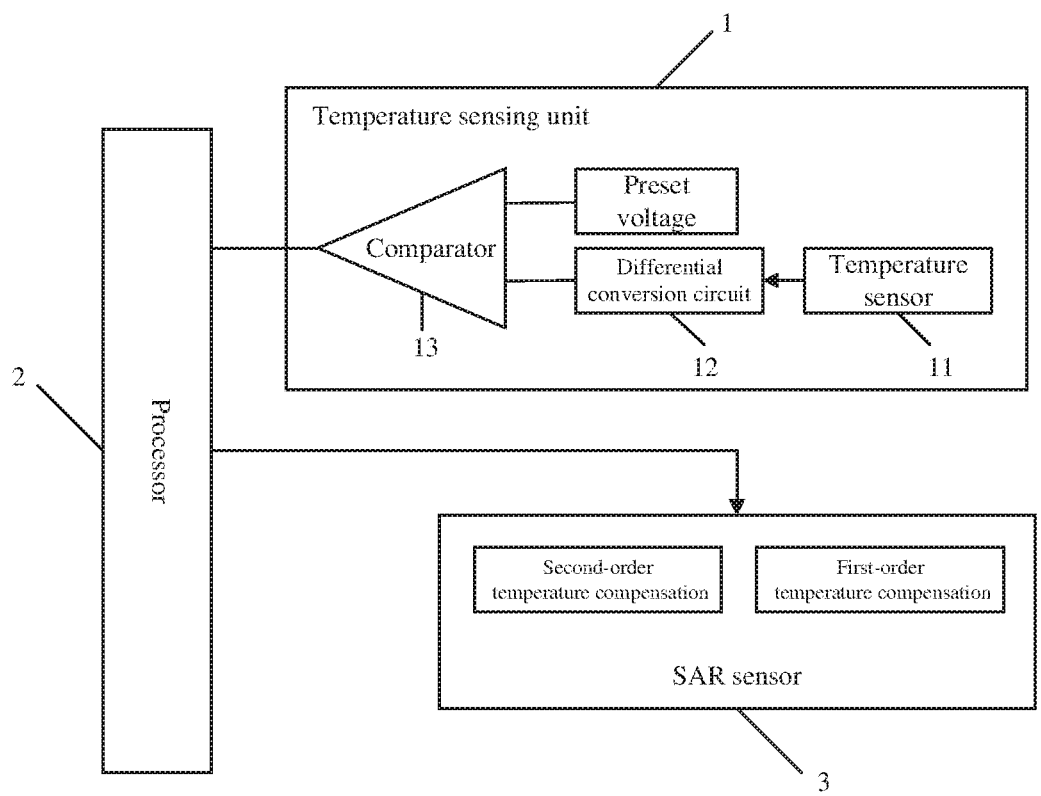
FIG. 2 is a structural schematic diagram of a terminal according to an embodiment of the present invention.

FIG. 2 exemplarily illustrates a structural schematic diagram of a terminal according to an embodiment of the present invention, and as shown in FIG. 2, the terminal may comprise: a temperature sensing unit 1, a processor 2 and an SAR sensor 3.

The temperature sensing unit 1 is electrically connected with the processor and configured to send a first trigger signal to the processor 2 in response to detecting that a temperature change amount of the SAR sensor 3 exceeds a preset value.

The processor 2 is electrically connected with the SAR sensor 3 and configured to send a first temperature control signal to the SAR sensor upon receiving the first trigger signal.

The SAR sensor 3 is configured to activate a second-order temperature compensation of the SAR sensor 3 according to the first temperature control signal, wherein the second-order temperature compensates for baseline data of the SAR sensor 3 together with the first-order temperature compensation of the SAR sensor 3.

Alternatively, as shown in FIG. 2, in order to detect the temperature of the SAR sensor, calculate the temperature change amount, and send the first trigger signal to the processor 2 when it is detected that the temperature change amount of the SAR sensor 3 exceeds the preset value, in one implementation, the temperature sensing unit 1 may include: a temperature sensor 11, a differential conversion circuit 12, and a comparator 13.

The temperature sensor 11 is configured to send the measured temperature in the differential conversion circuit 12.

The differential conversion circuit 12 is electrically connected with the temperature sensor 11 and configured to calculate the temperature change amount according to the temperature transmitted by the temperature sensor within a preset time period; determine a trigger voltage according to the temperature change amount and a preset thermoelectric conversion coefficient, and send the trigger voltage to the comparator 13.

The comparator 13 is electrically connected with the differential conversion circuit 12 and configured to compare the trigger voltage with a preset voltage, and send the first trigger signal to the processor 2 if the trigger voltage is greater than the preset voltage. For example, the comparator may send a low level to one of chip pins of the processor, which indicates sending the first trigger signal to the processor; naturally, in a specific implementation, the comparator may also send a high level to one of the chip pins of the processor to indicate sending the first trigger signal to the processor.

In order to enable the temperature sensor 11 to measure the temperature change of the SAR sensor 3 in time, in a specific implementation, the temperature sensor may be disposed on a periphery of the SAR sensor 3, and the closer the temperature sensor 11 is to the SAR sensor 3, the better the performance is.

Alternatively, the temperature sensor 11 may be a thermistor or other types of thermosensitive module, so as to monitor the temperature of the SAR sensor 3 in real time.

Alternatively, the preset value may be set according to experience, for example, the preset value may be defined according to actual tests of the effect of different SAR sensors on temperature compensation. For example, if the effect of the first-order temperature compensation of the SAR sensor is excellent, the preset value may be set to be larger, whereas, if the effect of the first-order temperature compensation of the SAR sensor is not very good, the preset value may be set to be smaller, and compensation is made through the second-order temperature compensation.

Specifically, after the temperature sensor 11 sends the measured temperature to the differential conversion circuit 12, the differential conversion circuit 12 calculates the temperature change amount based on the temperature transmitted by the temperature sensor 11 within a preset time period. For example, the preset time period is 1 minute, and assuming that the temperatures measured by the temperature sensor 11 are 10° C. at 14:48 on Mar. 20, 2018 and 12° C. at 14:49 on Mar. 20, 2018, the temperature change amount is 2, and the preset time period is 1.

Thereafter, the differential conversion circuit 12 determines the trigger voltage according to the temperature change amount and a preset thermoelectric conversion coefficient.

Specifically, the differential conversion circuit 12 may determine the trigger voltage according to the following formula 1:

$$V_{out} = K \times \left|\frac{\Delta T}{t}\right| \quad \text{(formula 1)}$$

where K is a proportional constant, $\Delta T$ is a temperature change amount in a preset time period t, and $V_{out}$ is the trigger voltage, wherein K is determined in accordance with parameters of the differential conversion circuit 12.

As can be seen from the above formula 1, the differential conversion circuit 12 detects the temperature change amount, and the value of the trigger voltage is larger when the temperature changes more drastically within the preset time period, whereas the value of the trigger voltage is smaller when the temperature changes less drastically within the preset time period; even in an extreme case, the value of the trigger voltage is zero when the temperature does not change within the preset time period. Alternatively, after the differential conversion circuit 12 determines the trigger voltage according to the formula 1, the trigger voltage may be sent to the comparator 13 that compares the trigger voltage with a preset voltage, and when the trigger voltage is greater than the preset voltage, the first trigger signal may be sent to the processor 2 which may send the first temperature control signal to the SAR sensor 3 after receiving the first trigger signal, and the SAR sensor 3 ay activate the second-order temperature compensation of the SAR sensor 3 after receiving the first temperature control signal. Moreover, when the trigger voltage is not greater than the preset voltage, a second trigger signal can be sent to the processor, that is, when the trigger voltage is less than or equal to the preset voltage, the second trigger signal may be sent to the processor 2 which sends a second temperature control signal to the SAR sensor 3 when receiving the second trigger signal, and after the SAR sensor 3 receives the second temperature control signal, the second-order temperature compensation can be stopped, and only the first-order temperature compensation is performed on the SAR sensor. Different preset voltages can be set according to different application scenarios by regulating an amplitude of the preset voltage through a software program.

Specifically, after receiving the first temperature control signal, the SAR sensor 3 may perform the first-order temperature compensation according to the following formula 2 and perform the second-order temperature compensation according to the following formula 3 and the following formula 4; after receiving the second temperature control signal, the SAR sensor 3 may perform the first-order temperature compensation according to the following formula 2.

$$f(T)=f(T_0)+s(T-T_0) \quad \text{(formula 2)}$$

According to the formula $f(T)=f(T_0)+s(T-T_0)+r(T-T_0)^2$ (formula 3) where r in the formula 3 can be obtained by the following formula 4

$$r=V_{out} \times F \quad \text{(Formula 4)}$$

where $T_0$ is a normal temperature, T is a current temperature, $f(T_0)$ is a basic electromagnetic wave absorption ratio when the temperature is $T_0$, s is a first-order compensation coefficient, $V_{out}$ is the trigger voltage, F is a proportional coefficient which can be adjusted and changed according to actual test data, and r is a second-order compensation coefficient.

It should be noted that, as can be seen from the above formula 2 and formula 3, in the second-order compensation, a quadratic small quantity is added on the basis of the first-order compensation, and in case where the temperature change does not cause the trigger voltage to be greater than the preset voltage, the quadratic small quantity is very small and can be ignored; however, in case where the temperature change causes the trigger voltage to be greater than the preset voltage, the quadratic small quantity cannot be ignored, and at this time, the second-order temperature compensation can be activated, that is, the second-order temperature compensation and the first-order temperature compensation together compensate for the baseline data of the SAR sensor.

Alternatively, the SAR sensor can also be connected to an antenna through an isolation module (a serially connected large inductor or others, without limitation), or the detection can be performed with a separate antenna of the SAR sensor.

Alternatively, a separate antenna may be provided in the terminal for detecting the parasitic capacitance, the antenna transmits the detected parasitic capacitance to the SAR sensor after detecting the parasitic capacitance, and then the terminal determines whether the human body is close to or far away from the terminal according to a difference between the parasitic capacitance received by the SAR sensor and the baseline data of the SAR sensor.

Specifically, if the difference between the parasitic capacitance and the SAR sensor is greater than a preset threshold, it is determined that the human body is close to the terminal, and if the difference between the parasitic capacitance and the SAR sensor is less than the preset threshold, it is determined that the human body is far away from the terminal.

Figure 3:
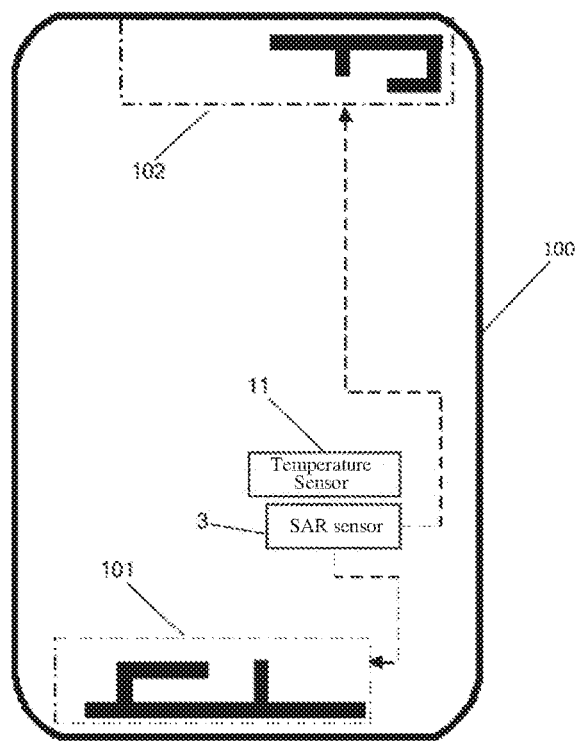
FIG. 3 is a structural schematic diagram of a connection between a terminal and an antenna according to an embodiment of the present invention.

Alternatively, the SAR sensor 3 can also be connected to the antenna of the terminal for receiving the parasitic capacitance detected by the antenna. For example, in one implementation, the SAR sensor of the terminal 100 can be connected to a lower antenna 101 and an upper antenna 102 of the terminal, for receiving the parasitic capacitances detected by these antennas, as shown in FIG. 3.

Alternatively, after receiving the parasitic capacitance detected by the antenna, the SAR sensor 3 may further determine that the human body is close to the terminal 100 if the difference between the parasitic capacitance and the baseline data is greater than the threshold; otherwise, it is determined that the human body is far away from the terminal 100.

After the antenna of the terminal detects the parasitic capacitance, the difference between the parasitic capacitance and the baseline data written in a storage area is used for deciding whether the human body is close to the terminal or far away from the terminal, and since the parasitic capacitance cannot be controlled when the temperature changes drastically, the influence of the temperature on the difference between the parasitic capacitance and the baseline data is reduced by means of compensating for the baseline data of the SAR sensor, and thus it is possible to be determined more accurately whether the human body is close to or far away.

The technical solution of the second-order compensation is explained in detail by a specific drawing below.

Figure 4:
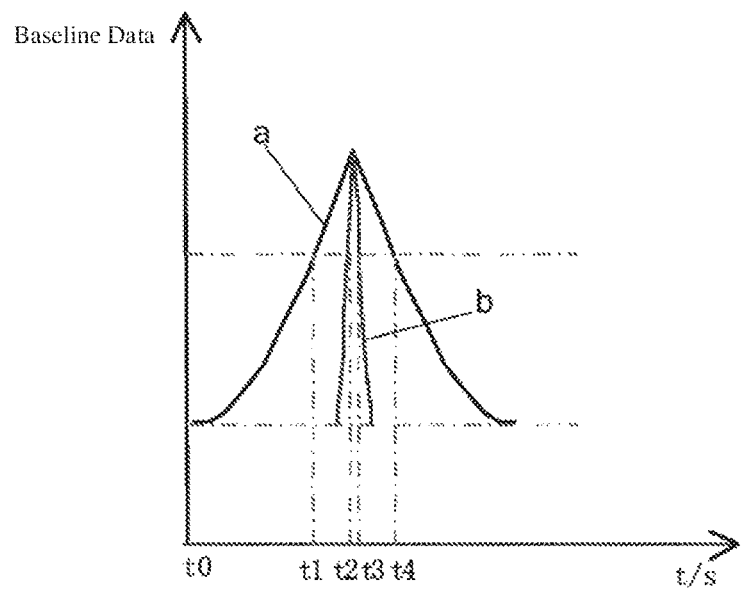
FIG. 4 is a graph showing a response of a first-order temperature compensation and a second-order temperature compensation according to an embodiment of the present invention.

Curve a in FIG. 4 is a response curve of the baseline data without a second-order temperature compensation and with a first-order temperature compensation only, while curve b is a synthetic curve with both a second-order temperature compensation and a first-order temperature compensation. It can be seen from FIG. 4 that, when the temperature changes rapidly, the time for tracking the baseline data with the first-order temperature compensation only is t1-t4, and the time for tracking the baseline data with both the first-order temperature compensation and the second-order temperature compensation is t2-t3, and it can also be seen from the drawing that the time period from t2 to t3 is also very short, therefore, when the temperature changes rapidly, the terminal can save the time for the determination from t1-t2 and t3-t4 by adopting the scheme of both the first-order temperature compensation and the second-order temperature compensation being performed together, as compared to the scheme of adopting only the first-order temperature compensation, it is possible to effectively shorten the corresponding transition time of the baseline data after the temperature changes rapidly, and thus it is possible to determine more accurately that whether the terminal is far away.

It follows that, when the temperature change amount exceeds the preset value, the first trigger signal is sent to the processor, and the processor sends the first temperature control signal to the SAR sensor after receiving the first trigger signal, then the SAR sensor activates the second-order temperature compensation of the SAR sensor according to the first temperature control signal, i.e. the second-order temperature compensation and the first-order temperature compensation of the SAR sensor together compensate for the baseline data of the SAR sensor, therefore, in some application scenarios with relatively rapid temperature change, the second-order temperature compensation and the first-order temperature compensation of the SAR sensor together compensate for the baseline data of the SAR sensor, so as to ensure that the baseline data of the SAR sensor can track the temperature change amount in real time, and to avoid the problem of false trigger of the SAR sensor caused by the terminal when the temperature drastically changes from low to high or from high to low; if the temperature change amount does not exceed the preset value, the second-order temperature compensation will not be triggered, and the first-order temperature compensation of the SAR sensor is still adopted to compensate for the baseline data of the SAR sensor, thus the problem of false trigger of the SAR sensor will not occur in various temperature change scenarios of the terminal, and resource scheduling and power consumption of the terminal can also be reduced.

Figure 5:
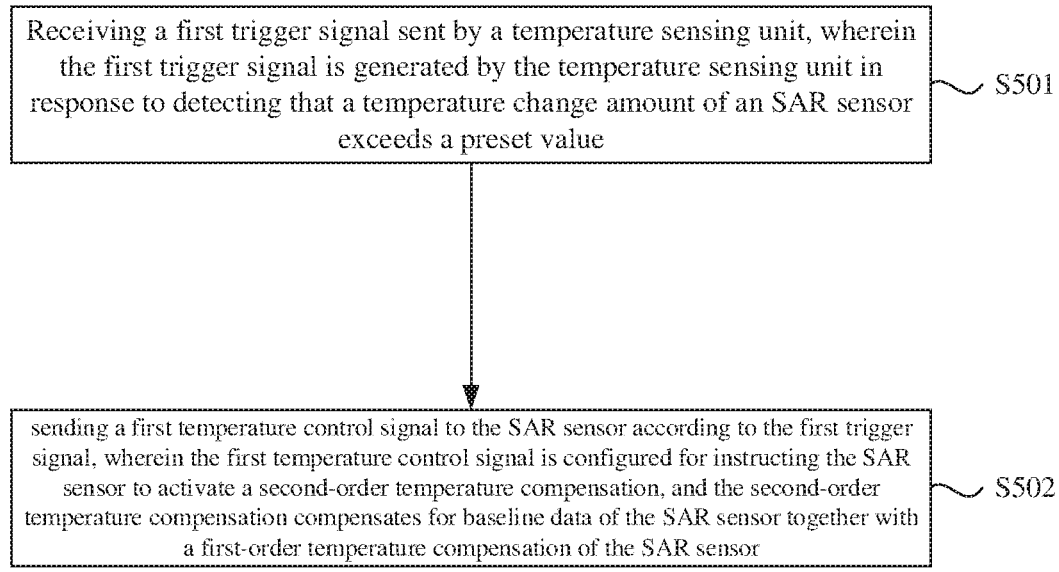
FIG. 5 is a flowchart of a temperature compensation method for an SAR sensor of a terminal according to an embodiment of the present invention.

Based on the same technical concept, an embodiment of the present application further provides a temperature compensation method for an SAR sensor of a terminal comprising a processor, a temperature sensing unit, and an SAR sensor, and as shown in FIG. 5, the method may comprise:

S501: receiving a first trigger signal sent by the temperature sensing unit, wherein the first trigger signal is generated by the temperature sensing unit in response to detecting that a temperature change amount of the SAR sensor exceeds a preset value;

S502: sending a first temperature control signal to the SAR sensor according to the first trigger signal, wherein the first temperature control signal is used for instructing the SAR sensor to activate a second-order temperature compensation, the second-order temperature compensation and a first-order temperature compensation of the SAR sensor together compensating for baseline data of the SAR sensor.

In order to reduce resource scheduling and power consumption of the terminal, after the second-order temperature compensation and the first-order temperature compensation of the SAR sensor together compensate for the baseline data of the SAR sensor, a second trigger signal sent by the temperature sensing unit can be received, wherein the second trigger signal is generated by the temperature sensing unit in response to detecting that the temperature change amount does not exceed the preset value; then, a second temperature control signal is sent to the SAR sensor according to the second trigger signal, wherein the second temperature control signal is used for instructing the SAR sensor to stop the second-order temperature compensation, and the first-order temperature compensation functions as compensating for the baseline data of the SAR sensor.

Alternatively, the first-order temperature compensation may be performed according to the formula 2, and the second-order temperature compensation may be performed according to the formula 3 and the formula 4.

Alternatively, the temperature sensing unit includes a temperature sensor, a differential conversion circuit, and a comparator, and before receiving the first trigger signal sent by the temperature sensing unit, Lite method further comprises: the differential conversion circuit receiving the temperature measured by the temperature sensor and calculating the temperature change amount according to the temperature transmitted by the temperature sensor within a preset time period; and determining a trigger voltage according to the temperature change amount and a preset thermoelectric conversion coefficient, and sending the trigger voltage to the comparator, so that the comparator compares the trigger voltage with a preset voltage, and sends the first trigger signal if the trigger voltage is greater than the preset voltage.

Alternatively, the method further comprises:
receiving, by the SAR sensor, parasitic capacitance detected by an antenna of the terminal, and determining that a human body is close to the terminal if a difference between the parasitic capacitance and the baseline data is greater than a preset threshold; otherwise, determining that the human body is far away from the terminal.

In summary, according to the temperature compensation method for a SAR sensor of a terminal and the terminal provided by the above embodiments, when the temperature change amount exceeds the preset value, a first trigger signal is sent to the processor, and the processor sends a first temperature control signal to the SAR sensor after receiving the first trigger signal, then the SAR sensor activates a second-order temperature compensation of the SAR sensor according to the first temperature control signal, i.e. the second-order temperature compensation and a first-order temperature compensation of the SAR sensor together compensate for the baseline data of the SAR sensor, therefore, in some application scenarios with relatively rapid temperature change, the baseline data of the SAR sensor is compensated for by the second-order temperature compensation together with the first-order temperature compensation of the SAR sensor, so as to ensure that the baseline data of the SAR sensor can track the temperature change amount in real time, and to avoid the problem of false trigger of the SAR sensor caused by the terminal when the temperature drastically changes from low to high or from high to low; if the temperature change amount does not exceed the preset value, the second-order temperature compensation will not be triggered, and the first-order temperature compensation of the SAR sensor is still adopted to compensate for the baseline data of the SAR sensor, thus the problem of false trigger of the SAR sensor will not occur in various temperature change scenarios of the terminal, and resource scheduling and power consumption of the terminal can also be reduced.

Based on the same concept, the embodiments of the present application provide another kind of terminal performing the above-mentioned flow of the temperature compensation method for the SAR sensor of the terminal. The above-mentioned terminal structure shown in FIG. 2 may further include a memory which may communicate with the processor through a bus.

The memory is configured to store a program. In particular, the program may include program code comprising computer operation instructions. The memory may be a volatile memory, such as a random-access memory (RAM for short); or may be a non-volatile memory, such as a flash memory, a hard disk drive (HDD for short) or a solid-state drive (SSD for short); or may be a combination of any one or more kinds of the above volatile memory and non-volatile memory.

The processor may be a Central Processing Unit (CPU for short), a Network Processor (NP for short), or a combination of CPU and NP. The processor may also be a hardware chip. The hardware chip may be an application-specific integrated circuit (ASIC for short), a programmable logic device (PLD for short), or a combination thereof. The PLD may be a complex programmable logic device (CPLD for short), a field-programmable gate array (FPGA for short), a general array logic (GAL for short), or any combination thereof.

The memory is configured to store program instructions;

The processor is configured to call the program instructions stored in the memory and perform the temperature compensation method for a SAR sensor of a terminal according to the obtained program.

The embodiments of the present application further provide a computer storage medium configured for storing computer program instructions used by the computing device, which includes a program for executing the temperature compensation method for a SAR sensor of a terminal.

The computer storage media may be any available media or data storage device that can be accessed by a computer, including, but not limited to, a magnetic memory (e.g., floppy disks, hard disk drive, magnetic tape, magneto-optical disk (MO), etc.), an optical memory (e.g., CD, DVD, BD, HVD, etc.), and a semiconductor memory (e.g., ROM, EPROM, EEPROM, non-volatile memory (NAND FLASH), Solid State Disk (SSD)), etc.

Those skilled in the art would appreciate that the embodiments of the present invention may provide a method, a system, or a computer program product. Thus, the embodiments of the present application can be implemented entirely by hardware, entirely by software, or by both software and hardware. In addition, the embodiments of the present application may be in the form of a computer program product which can be implemented in one or more computer-available storage medium (including, but not limited to, a disk memory, a CD-ROM, an optical memory, and the like) containing computer-available program codes.

While the preferred embodiments of the present application have been described, additional variations and modifications in those embodiments may occur to those skilled in the art once they learn the basic inventive concepts. Therefore, it is intended that the appended claims are interpreted as including the preferred embodiment and all variations and modifications that fall within the scope of the present application.

It will be apparent to those skilled in the art that various variations and modifications may be made in the present invention without departing from the spirit and scope of the invention. Thus, if such modifications and variations of the present application fall within the scope of the claims of the present application and their equivalents, the present application is also intended to include such modifications and variations.

What is claimed is:

1. A terminal, comprising: a temperature sensing unit, a processor and a Specific Absorption Rate (SAR) sensor; wherein
    the temperature sensing unit is electrically connected with the processor and configured to send a first trigger signal to the processor in response to detecting that a temperature change amount of the SAR sensor exceeds a preset value;
    the processor is electrically connected with the SAR sensor and configured to send a first temperature control signal to the SAR sensor upon receiving the first trigger signal; and
    the SAR sensor is configured to activate a second-order temperature compensation of the SAR sensor according to the first temperature control signal, and the second-order temperature compensation compensates for baseline data of the SAR sensor together with a first-order temperature compensation of the SAR sensor.

2. The terminal according to claim 1, wherein the temperature sensing unit comprises a temperature sensor, a differential conversion circuit and a comparator; and wherein
    the temperature sensor is configured to send a measured temperature to the differential conversion circuit;
    the differential conversion circuit is electrically connected with the temperature sensor and configured to calculate the temperature change amount according to the temperature sent by the temperature sensor within a preset time period; determine a trigger voltage according to the temperature change amount and a preset thermoelectric conversion coefficient, and send the trigger voltage to the comparator;
    the comparator is electrically connected with the differential conversion circuit and configured to compare the trigger voltage with a preset voltage and send the first trigger signal to the processor if the trigger voltage is greater than the preset voltage.

3. The terminal according to claim 2, wherein
the comparator is further configured to send a second trigger signal to the processor when the trigger voltage is not greater than the preset voltage;
the processor is further configured to send a second temperature control signal to the SAR sensor upon receiving the second trigger signal; and
the SAR sensor is further configured to stop the second-order temperature compensation according to the second temperature control signal, and the first-order temperature compensation of the SAR sensor functions to compensate for the baseline data of the SAR sensor.

4. The terminal according to claim 2, wherein the temperature sensor is disposed on a periphery of the SAR sensor.

5. The terminal according to claim 2, wherein
the differential conversion circuit is configured to determine the trigger voltage according to a formula $$V_{out} = K \times \left|\frac{\Delta T}{t}\right|,$$

where K is a proportional constant, $\Delta T$ is a temperature change amount in a preset time period t, and $V_{out}$ is the trigger voltage.

6. The terminal according to claim 1, wherein the SAR sensor is configured to perform the first-order temperature compensation according to a formula $f(T)=f(T_0)+s(T-T_0)$; and
perform the second-order temperature compensation according to formulas $$f(T)=f(T_0)+s(T-T_0)+r(T-T_0)^2 \text{ and } r=V_{out} \times F;$$

where $T_0$ is a normal temperature, T is a current temperature, $f(T_0)$ is a basic electromagnetic wave absorption ratio when the temperature is $T_0$, S is a first-order compensation coefficient, $V_{out}$ is a trigger voltage, F is a proportional coefficient and r is a second-order compensation coefficient.

7. The terminal according claim 1, wherein
the SAR sensor is electrically connected with an antenna of the terminal and is configured to receive a parasitic capacitance detected by the antenna;
the SAR sensor is further configured to determine that a human body is close to the terminal if a difference between the parasitic capacitance and the baseline data is greater than a preset threshold; and otherwise, determine that the human body is far away from the terminal.

8. A temperature compensation method for a Specific Absorption Rate (SAR) sensor of a terminal, comprising:
receiving a first trigger signal sent by a temperature sensing unit, wherein the first trigger signal is generated by the temperature sensing unit in response to detecting that a temperature change amount of the SAR sensor exceeds a preset value; and
sending a first temperature control signal to the SAR sensor according to the first trigger signal, wherein the first temperature control signal is used for instructing the SAR sensor to activate a second-order temperature compensation, and the second-order temperature compensation compensates for baseline data of the SAR sensor together with a first-order temperature compensation of the SAR sensor.

9. The method according to claim 8, wherein after the second-order temperature compensation and the first-order temperature compensation of the SAR sensor together compensate for baseline data of the SAR sensor, the method further comprises:
receiving a second trigger signal sent by the temperature sensing unit, wherein the second trigger signal is generated by the temperature sensing unit in response to detecting that the temperature change amount does not exceed the preset value; and
sending a second temperature control signal to the SAR sensor according to the second trigger signal, wherein the second temperature control signal is used for instructing the SAR sensor to stop the second-order temperature compensation and use the first-order temperature compensation to compensate for the baseline data of the SAR sensor.

10. The method according to claim 8, wherein
the first-order temperature compensation is performed according to a formula $$f(T)=f(T_0)+s(T-T_0); \text{ and}$$

the second-order temperature compensation is performed according to formulas $$f(T)=f(T_0)+s(T-T_0)+r(T-T_0)^2 \text{ and } r=V_{out} \times F;$$

where $T_0$ is a normal temperature, T is a current temperature, $f(T_0)$ is a basic electromagnetic wave absorption ratio when the temperature is $T_0$, S is a first-order compensation coefficient, $V_{out}$ is a trigger voltage, F is a proportional coefficient and r is a second-order compensation coefficient.

11. A terminal, comprising:
a memory configured to store program instructions; and
a processor configured to call the program instructions stored in the memory and perform a temperature compensation for a Specific Absorption Rate (SAR) sensor of a terminal, comprising:
receiving a first trigger signal sent by a temperature sensing unit, wherein the first trigger signal is generated by the temperature sensing unit in response to detecting that a temperature change amount of the SAR sensor exceeds a preset value; and
sending a first temperature control signal to the SAR sensor according to the first trigger signal, wherein the first temperature control signal is used for instructing the SAR sensor to activate a second-order temperature compensation, and the second-order temperature compensation compensates for baseline data of the SAR sensor together with a first-order temperature compensation of the SAR sensor.

12. The terminal according to claim 11, wherein the processor is further configured to perform the temperature compensation by, after the second-order temperature compensation and the first-order temperature compensation of the SAR sensor together compensate for baseline data of the SAR sensor:
receiving a second trigger signal sent by the temperature sensing unit, wherein the second trigger signal is generated by the temperature sensing unit in response to detecting that the temperature change amount does not exceed the preset value; and
sending a second temperature control signal to the SAR sensor according to the second trigger signal, wherein the second temperature control signal is used for instructing the SAR sensor to stop the second-order temperature compensation and use the first-order temperature compensation to compensate for the baseline data of the SAR sensor.

13. The terminal according to claim 11, wherein the first-order temperature compensation is performed according to a formula $$f(T)=f(T_0)+s(T-T_0);\text{ and}$$

the second-order temperature compensation is performed according to formulas $$f(T)=f(T_0)+s(T-T_0)+r(T-T_0)^2 \text{ and } r=V_{out} \times F;$$

where $T_0$ is a normal temperature, T is a current temperature, $f(T_0)$ is a basic electromagnetic wave absorption ratio when the temperature is $T_0$, s is a first-order compensation coefficient, $V_{out}$ is a trigger voltage, F is a proportional coefficient and r is a second-order compensation coefficient.

* * * * *